(12) United States Patent
Hoppin

(10) Patent No.: US 8,420,750 B2
(45) Date of Patent: Apr. 16, 2013

(54) COPOLYMERS OF DIBENDIAZOCINE WITH DIFUNCTIONAL MONOMERS CONTAINING SULFONE AND/OR KETONE UNITS

(75) Inventor: Charles Hoppin, Alpharetta, GA (US)

(73) Assignee: Solvay Advanced Polymers, L.L.C., Alpharetta, GA (US)

( * ) Notice: Subject to any disclaimer, the term of this patent is extended or adjusted under 35 U.S.C. 154(b) by 191 days.

(21) Appl. No.: 12/865,776

(22) PCT Filed: Feb. 10, 2009

(86) PCT No.: PCT/EP2009/051478
§ 371 (c)(1),
(2), (4) Date: Aug. 2, 2010

(87) PCT Pub. No.: WO2009/101064
PCT Pub. Date: Aug. 20, 2009

(65) Prior Publication Data
US 2011/0009563 A1    Jan. 13, 2011

Related U.S. Application Data

(60) Provisional application No. 61/027,519, filed on Feb. 11, 2008.

(51) Int. Cl.
*C08F 283/00*    (2006.01)
*C08G 73/06*     (2006.01)
*C08G 73/00*     (2006.01)

(52) U.S. Cl.
USPC .............. 525/540; 525/328.2; 525/328.4; 528/172; 528/211; 524/609; 524/611

(58) Field of Classification Search .......... 524/609, 524/611; 528/172, 211; 525/540, 328.2, 525/328.4
See application file for complete search history.

(56) References Cited

U.S. PATENT DOCUMENTS
2006/0058499 A1    3/2006    Lee et al.

FOREIGN PATENT DOCUMENTS
WO    WO 2005/105922 A2    11/2005

OTHER PUBLICATIONS

U.S. Appl. No. 13/517,233, filed Jun. 19, 2012, Hoppin.

*Primary Examiner* — Duc Truong
(74) *Attorney, Agent, or Firm* — Oblon, Spivak, McClelland, Maier & Neustadt, L.L.P.

(57) ABSTRACT

Copolymers comprising recurring units (A) of one or more of the general structural formulae -D-G-$Ar_b$-G-, -G-D-G-$Ar_b$- and/or -D-G- on one hand, and recurring units (B) of one or more of the general structural formulae —$Ar_a$-G-$Ar_b$-G-, -G-$Ar_a$-G-$Ar_b$- and/or —$Ar_a$-G- on the other hand, wherein D is a dibenzodiazocine-containing divalent group, $Ar_a$ is a dibenzodiazocine-free divalent group containing a sulfone unit and/or a ketone unit, $Ar_b$ is a dibenzodiazocine-free divalent group, and G is an ether or a thiether group. Preferably, recurring units (A) are of the general structural formula -D-G-$Ar_b$-G- and recurring units (B) are of the general structural formula —$Ar_a$-G-$Ar_b$-G-. Method for the preparation of the copolymers, compositions and articles made of the copolymers are also part of the invention.

14 Claims, No Drawings

COPOLYMERS OF DIBENDIAZOCINE WITH DIFUNCTIONAL MONOMERS CONTAINING SULFONE AND/OR KETONE UNITS

CROSS-REFERENCE TO RELATED APPLICATIONS

This application is a U.S. national stage application under 35 U.S.C. 371 of International Application No. PCT/EP2009/051478 filed Feb. 10, 2009 which claims priority to U.S. provisional application 61/027,519, filed Feb. 11, 2008, the whole content of which is herein incorporated by reference for all purposes.

FIELD OF THE INVENTION

The present invention relates to copolymers of dibenzodiazocine with difunctional monomers containing sulfone and/or ketone units. The invention also relates to a process for the preparation of said copolymers as well as to applications of those polymers.

DESCRIPTION OF THE RELATED ART

Polymers containing either or both the following dibenzodiazocine recurring units

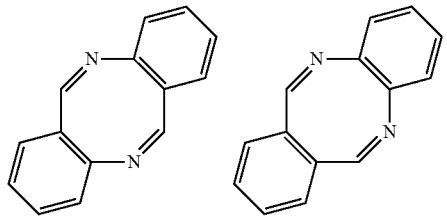

have been recently described in document US-A-2006/0058499, the whole content of which is herein incorporated herein by reference.

Interesting properties of these amorphous polymers are, notably, their high glass transition temperature (~300-325° C.), their high thermal stability, their low moisture absorption (~0.1%, 24 hr/25° C.), their low dielectric constant (2.6-2.9) and their good flame resistance. They are thus usable as dielectric materials in various electric and electronic applications. Moreover, the dibenzodiazocine recurring units are diazo derivatives of [8] annulenes (or cyclooctatetraenes), and are therefore expected to be promising in electromechanical actuating devices based on the redox-induced conformational change of [8] annulene units. Artificial muscles are an application of such actuating devices.

Research and development work conducted on these dibenzodiazocine polymers have revealed however that they are somewhat deficient in a number of properties like chemical resistance and melt processability.

Poly(aryl ether sulfone)s, in particular polyphenylsulfones (PPSU), on one hand, and poly(aryl ether ketone)s, in particular polyetheretherketones (PEEK), on the other hand, are other known engineering thermoplastic polymers featuring also high glass transition temperature, high thermal stability and good flame resistance, to a lesser degree than the dibenzodiazocine polymers, but without suffering from the above-mentioned drawbacks.

The present invention aims to overcome these disadvantages by providing new polymer materials comprising dibenzodiazocine-based recurring units and sulfone and/or ketone-containing recurring units, while, in the same time, improving at least one of the properties of each of their polymeric constituents, selected among glass transition temperature, thermal stability, flame resistance, chemical resistance and melt processability, preferably more than one of these properties; still more preferably, these new polymeric compositions feature an improved balance of all of these properties.

SUMMARY OF THE INVENTION

A first aspect of the present invention concerns copolymers (C) comprising recurring units (A) of the general structural formula: -D-G-$Ar_b$-G- and recurring units (B) of the general structural formula: —$Ar_a$-G-$Ar_b$-G-
wherein:
D is at least one dibenzodiazocine-containing divalent group;
$Ar_a$ is at least one dibenzodiazocine-free divalent group selected among $C_{12}$-$C_{50}$ divalent groups (GS) containing at least one sulfone unit [—S(=O)$_2$—] and at least two $C_6$-$C_{40}$ arylene units; $C_{12}$-$C_{50}$ divalent groups (GK) containing at least one ketone unit [—C(=O)—] and at least two $C_6$-$C_{40}$ arylene units; and mixtures of said $C_{12}$-$C_{50}$ divalent groups;
each $Ar_b$ is at least one dibenzodiazocine-free divalent group selected among $C_6$-$C_{50}$ arylene groups and $C_{12}$-$C_{50}$ aromatic hydrocarbon groups of the general formula (I)

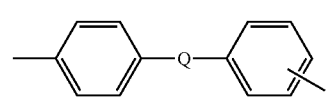

(I)

wherein the unassigned positional isomer is either meta or para to Q, and Q is a direct covalent bond or a divalent group containing from 0 to 38 carbon atoms, the $Ar_b$ being independently chosen from each other;
each G is at least one divalent group selected among ether groups (—O—) and thioether groups (—S—), the G being independently chosen from each other.

Preferably, in the copolymers (C), the divalent group $Ar_b$ contained in the recurring units (A) is identical to the divalent group $Ar_b$ contained in the recurring units (B). Also preferably, the divalent groups G contained in the recurring units (A) are identical to each other on one hand, and to the divalent groups G contained in the recurring units (B) on the other hand.

Preferably, the recurring units of the copolymers (C) consist essentially of recurring units (A) and (B).

Preferably, in the copolymers (C), the divalent group D is of the following formula:

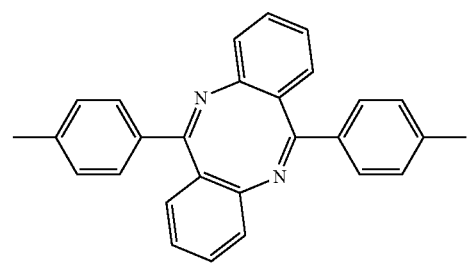

(D1)

In a certain preferred embodiment, the divalent group $Ar_a$ contained in the copolymers (C) is:

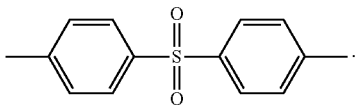

In another preferred embodiment, the divalent group $Ar_a$ contained in the copolymers (C) is

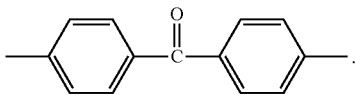

Preferably, in the copolymers (C), each divalent group $Ar_b$ is p-biphenylene:

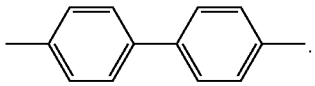

Preferably, in the copolymers (C), each divalent group G is an ether group (—O—).

Another aspect of the present invention concerns a method for preparing copolymers, which comprises synthesizing said copolymers via step-growth polymerization involving nucleophilic displacement reactions between:

at least one difunctional monomer (M1) comprising a divalent group D, of general formula X-D-X,
at least one difunctional monomer (M2) comprising a divalent group $Ar_a$, of general formula X—$Ar_a$—X, and
at least one difunctional monomer (M3) comprising a divalent group $Ar_b$, of general formula H-G-$Ar_b$-G-H, wherein:
each H is a hydrogen atom;
each X is at least one divalent group selected from halogen atoms, nitro groups and mixtures thereof, the X being independently chosen from each other;
D is at least one dibenzodiazocine-containing divalent group;
$Ar_a$ is at least one dibenzodiazocine-free divalent group selected among $C_{12}$-$C_{50}$ divalent groups (GS) containing at least one sulfone unit [—S(=O)$_2$—] and at least two $C_6$-$C_{40}$ arylene units; $C_{12}$-$C_{50}$ divalent groups (GK) containing at least one ketone unit [—C(=O)—] and at least two $C_6$-$C_{40}$ arylene units; and mixtures of these groups;
each $Ar_b$ is at least one dibenzodiazocine-free divalent group selected among $C_6$-$C_{50}$ arylene groups and $C_{12}$-$C_{50}$ aromatic hydrocarbon groups of the general formula (I) as above defined, wherein the unassigned positional isomer is either meta or para to Q, and Q is a direct covalent bond or a divalent group containing from 0 to 38 carbon atoms, the $Ar_b$ being independently chosen from each other;
each G is at least one divalent group selected among ether groups (—O—) and thioether groups (—S—), the G being independently chosen from each other.

Preferably, the invented method is one for preparing the copolymers (C) as above described.

Preferably, in the invented method, the molar amount of the monomer (M3) is substantially equal to the sum of the molar amounts of the monomers (M1) and (M2).

In the invented method, each X is preferably a fluorine atom.

In the invented method, the difunctional monomer (M2) is preferably a diol of general formula HO—$Ar_b$—OH.

Still another aspect of the present invention concerns copolymers (C') comprising recurring units (A) and (B), said copolymers (C') being identical to the copolymers (C) as above described, except that:
the recurring units (A) of the copolymers (C') are of one or more of the general structural formulae:

-D-G-$Ar_b$-G-, -G-D-G-$Ar_b$- and/or -D-G-, and the recurring units (B) of the copolymers (C') are of one or more of the general structural formulae:

—$Ar_a$-G-$Ar_b$-G-, -G-$Ar_a$-G-$Ar_b$- and/or —$Ar_a$-G- wherein D, G, $Ar_a$ and $Ar_b$ are as previously defined for the copolymers (C).

Still another aspect of the present invention concerns polymer compositions containing:
at least one copolymer (C″) chosen among the copolymers (C) as above described, the copolymers prepared by the method as above described, and the copolymers (C') as above described, and
one or more ingredient(s) other than the copolymer (C″).

A last aspect of the present invention concerns shaped articles or shaped parts of article containing at least one polymer composition chosen among the polymer compositions as above described, or at least one copolymer (C″) chosen among the copolymers (C) as above described, the copolymers prepared by the method as above described and the copolymers (C') as above described.

DETAILED DESCRIPTION OF THE INVENTION

In its main aspect, the present invention relates to copolymers (C) comprising recurring units (A) of the general structural formula -D-G-$Ar_b$-G- and recurring units (B) of the general structural formula —$Ar_a$-G-$Ar_b$-G- wherein:
D is at least one dibenzodiazocine-containing divalent group;
$Ar_a$ is at least one dibenzodiazocine-free divalent group selected among $C_{12}$-$C_{50}$ divalent groups (GK) containing at least one ketone unit [—C(=O)—] and at least two $C_6$-$C_{40}$ arylene units;
each $Ar_b$ is at least one dibenzodiazocine-free divalent group selected among $C_6$-$C_{50}$ arylene groups and $C_{12}$-$C_{50}$ aromatic hydrocarbon groups of the general formula (I)

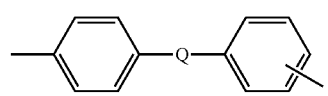

(I)

wherein the unassigned positional isomer is either meta or para to Q, and Q is a direct covalent bond or a divalent group containing from 0 to 38 carbon atoms, the $Ar_b$ being independently chosen from each other;
each G is at least one divalent group selected among ether groups (—O—) and thioether groups (—S—), the G being independently chosen from each other.

The Recurring Units (A)

The copolymers (C) in accordance with the invention comprise recurring units (A) of the general structural formula -D-G-$Ar_b$-G-.

In the copolymers (C), the weight of the recurring units (A), based on the total weight of the copolymers (C), may be of at least 1%, 2%, 3%, 5%, 10%, 15%, 20%, 30%, 40%, 50%, 60%, 70%, 80%, 85%, 90%, 95%, 97%, 98% or 99%. On the other hand, in the copolymers (C), the weight of the recurring units (A), based on the total weight of the copolymers (C), may be of at most 1%, 2%, 3%, 5%, 10%, 15%, 20%, 25%, 30%, 35%, 40%, 45%, 50%, 55%, 60%, 65%, 70%, 75%, 80%, 85%, 90%, 95%, 97%, 98% or 99%.

In the copolymers (C), the number of moles of the recurring units (A), based on the combined number of moles of the recurring units (A) and (B), may be of at least 1%, 2%, 3%, 5%, 10%, 15%, 20%, 30%, 40%, 50%, 60%, 70%, 80%, 85%, 90%, 95%, 97%, 98% or 99%. On the other hand, in the copolymers (C), the number of moles of the recurring units (A), based on the combined number of moles of the recurring units (A) and (B), may be of at most 1%, 2%, 3%, 5%, 10%, 15%, 20%, 25%, 30%, 35%, 40%, 45%, 50%, 55%, 60%, 65%, 70%, 75%, 80%, 85%, 90%, 95%, 97%, 98% or 99%. Good results were obtained notably when the number of moles of the recurring units (A), based on the combined number of moles of the recurring units (A) and (B), was of either about 20 mol. % or 50 mol. %.

As will be detailed later on, recurring units of the general structural formula -D-G-$Ar_b$-G- can be obtained notably by nucleophilic displacement reaction between at least one dihalodibenzodiazocine compound of general formula X-D-X, wherein X is a halogen atom (in particular, fluorine), on one hand, and at least one diol of general formula HO—$Ar_b$—OH on the other hand. The corresponding dithiol HS—$Ar_b$—SH can also be used in partial or complete replacement of the diol HO—$Ar_b$—OH.

The Recurring Units (B)

The copolymers (C) in accordance with the invention comprise recurring units (B) of the general structural formula —$Ar_a$-G-$Ar_b$-G-.

In the copolymers (C), the weight of the recurring units (B), based on the total weight of the copolymers (C), may be of at least 1%, 2%, 3%, 5%, 10%, 15%, 20%, 30%, 40%, 50%, 60%, 70%, 80%, 85%, 90%, 95%, 97%, 98% or 99%. On the other hand, in the copolymers (C), the weight of the recurring units (B), based on the total weight of the copolymers (C), may be of at most 1%, 2%, 3%, 5%, 10%, 15%, 20%, 25%, 30%, 35%, 40%, 45%, 50%, 55%, 60%, 65%, 70%, 75%, 80%, 85%, 90%, 95%, 97%, 98% or 99%.

As will be detailed later on, recurring units (B) of the general structural formula —$Ar_a$-G-$Ar_b$-G- can be obtained notably by nucleophilic displacement reaction between at least one dihalocompound of general formula X—$Ar_a$—X, wherein X is a halogen atom (in particular, fluorine), on one hand, and at least one diol of general formula HO—$Ar_b$—OH on the other hand; the corresponding dithiol HS—$Ar_b$—SH can also be used in partial or complete replacement of the diol HO—$Ar_b$—OH.

Optional Recurring Units (Z) Other than Recurring Units (A) and (B)

The copolymers (C) in accordance with the invention may further comprise recurring units (Z) other than recurring units (A) and (B).

The copolymers (C) in accordance with the invention may notably further comprise recurring units of one or more of the general structural formula —C(=O)—O—$Ar_b$—O—, $Ar_b$ as above defined; such recurring units can be obtained notably by nucleophilic displacement reaction between phosgene and at least one diol of general formula HO—$Ar_b$—OH. When two or more of such recurring units are directly linked together, they provide copolymers (C) comprising carbonate functional groups, as in —C(=O)—O—$Ar_b$—O—C(=O)—O—$Ar_b$—O—.

Still other recurring units (Z) include but are not limited to etherimide units (units comprising at least one ether group and at least one imide group); amideimide units (units comprising at least one amide group and at least one imide group); optionally substituted phenylene units (units consisting of a substituted or unsubstituted phenylene), imide units (units comprising at least one imide group); amide units (units comprising at least one amide group); ester units (units comprising at least one ester group); carbonate units (units comprising at least one carbonate group); urea units; and the like.

In the copolymers (C), the weight of the recurring units (Z), based on the total weight of the recurring units (A) and (B), may be of at least 1%, 2%, 3%, 5%, 10%, 20%, 30%, 40%, 50% or even more. On the other hand, in the copolymers (C), the weight of the recurring units (Z), based on the total weight of the recurring units (A) and (B), may be of at most 50%, 40%, 30%, 20%, 10%, 5%, 2% or 1%. The copolymers (C) may also be essentially free, or even free, of recurring units (Z) other than recurring units (A) and (B); precisely, good results were obtained with such copolymers (C), i.e. otherwise said, with copolymers the recurring units of which consist essentially of, or even consist of, recurring units (A) and (B).

The Divalent Group D

In the recurring units (A) of the copolymers (C) in accordance with the invention, D represents at least one dibenzodiazocine-containing divalent group.

A dibenzodiazocine-containing divalent group denotes generally any divalent group comprising one or more units selected from:

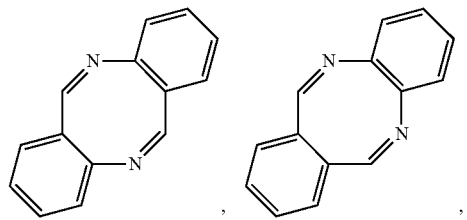 [SMILES: C1=N\c2ccccc2/C=N\c2ccccc2/1 ; C1=N\c2ccccc2/N=C\c2ccccc2/1]

the homologous of the above two units substituted by at least one substituting group, and mixtures thereof.

For the purpose of the present description, the term "at least one" means that, in an indifferent manner, all the recurring units (A) may include as group D the same dibenzodiazocine-containing divalent group, or different recurring units (A) may include as group G dibenzodiazocine-containing divalent groups having different formulae.

For the purpose of the present description, the term "substituting group" is intended to denote an atom or group of atoms substituted in place of a hydrogen atom. They are generally monovalent.

Preferably, the substituting groups are independently selected from the group consisting of H, alkyl, substituted alkyl, aryl, substituted aryl, heteroaryl, substituted heteroaryl, halogen, —CN, —CHO, —$COR_a$, —$CR_a$=$NR_b$, —$OR_a$, —$SR_a$, —$SO_2R_a$, —$POR_aR_b$, —$PO_3R_a$, —$OCOR_a$, —$CO_2R_a$, —$NR_aR_b$, —N=$CR_aR_b$, —$NR_aCOR_b$, —CON$R_aR_b$ in which $R_a$ and $R_b$ are independently selected from the group consisting of H, alkyl, substituted alkyl, aryl, substituted aryl, heteroaryl, and substituted heteroaryl and two or more of $R_1$-$R_8$, $R_a$, and $R_b$ may or may not be linked to form a ring structure.

In accordance with the present invention, the group D may be notably selected among at least one of the groups having the structure indicated by the following formulae:
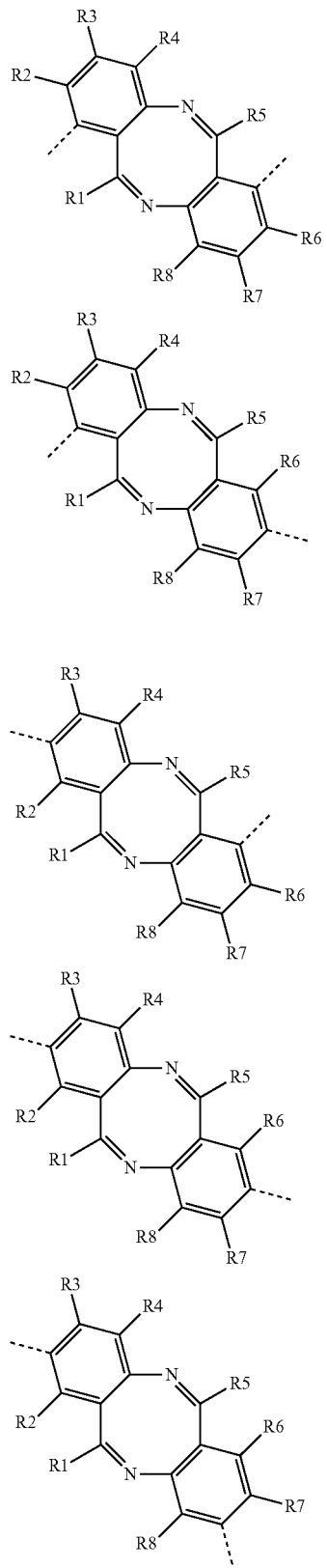
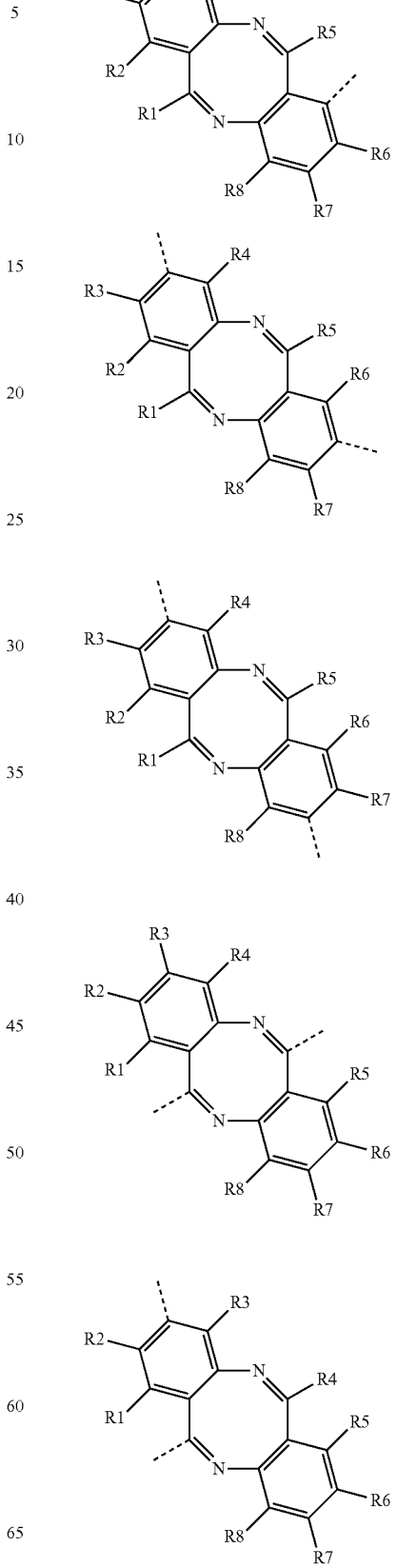

-continued
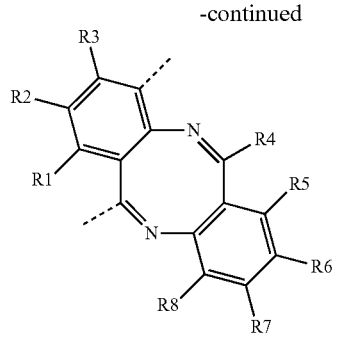
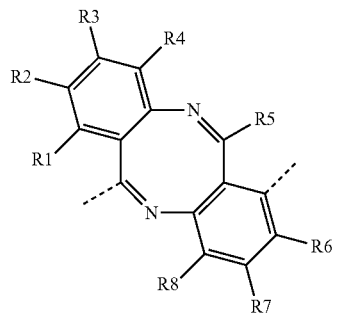
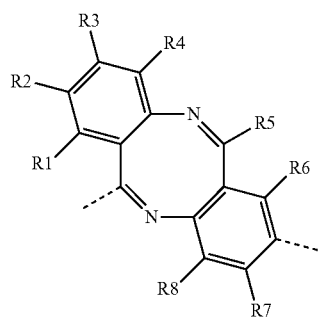
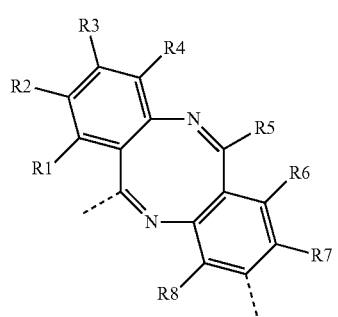
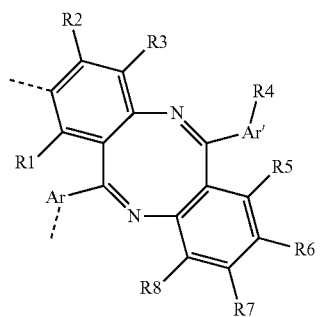
-continued
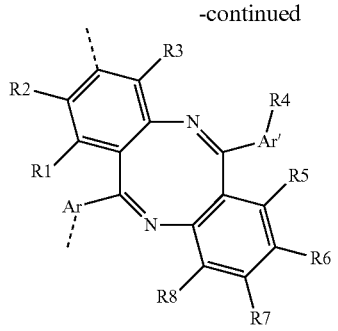
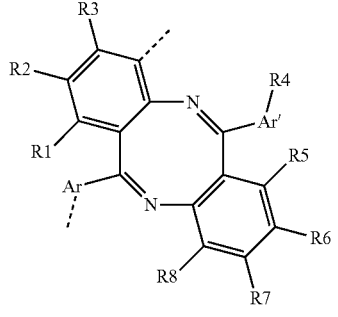
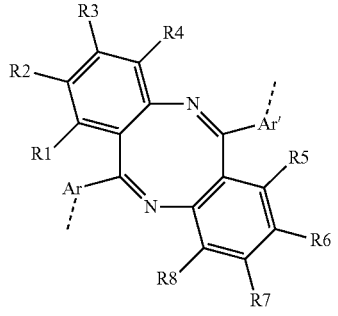
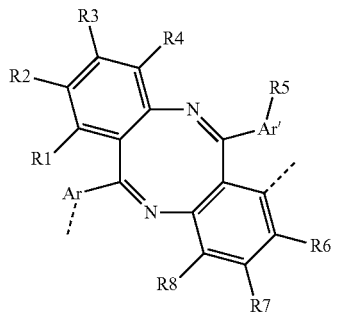
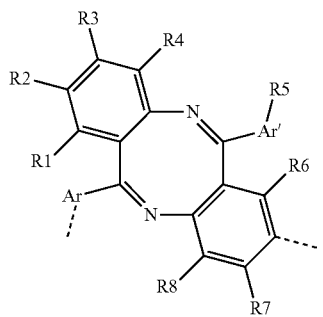

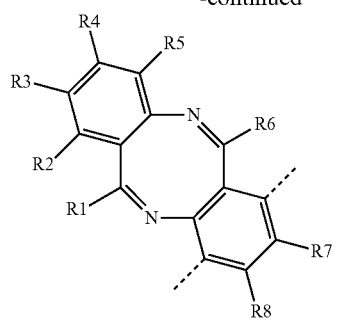
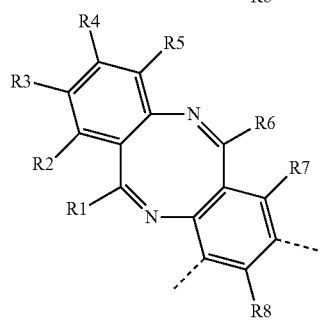
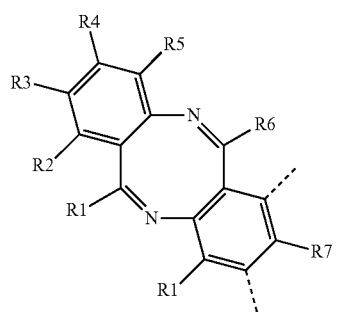
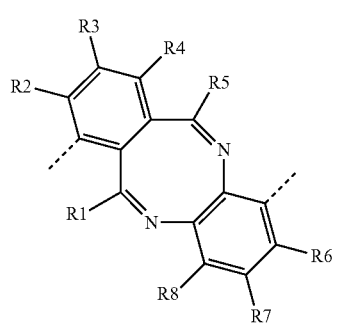
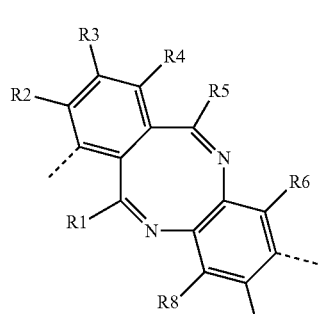
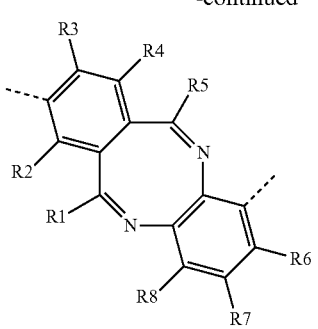
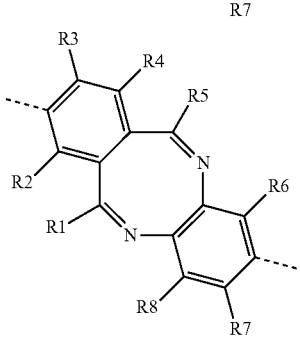
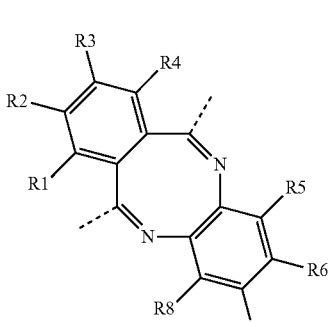
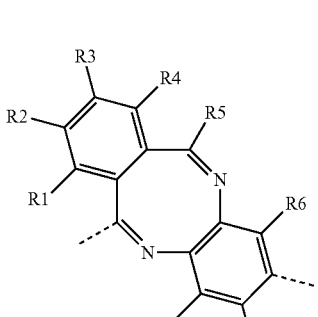
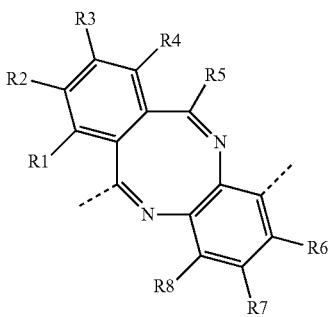

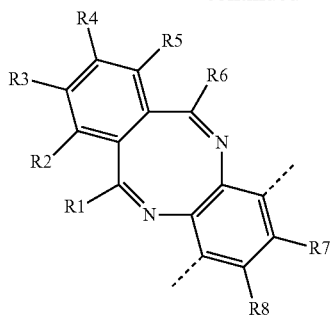

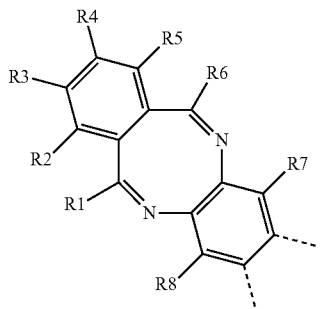

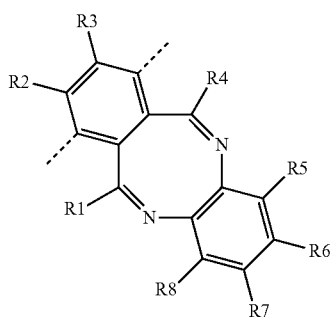

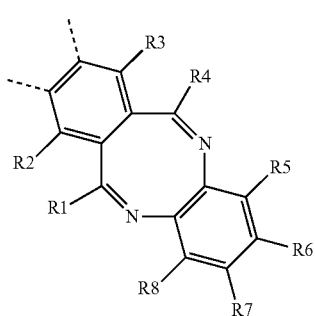

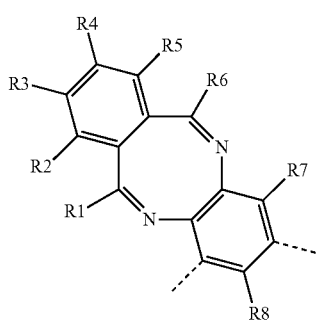

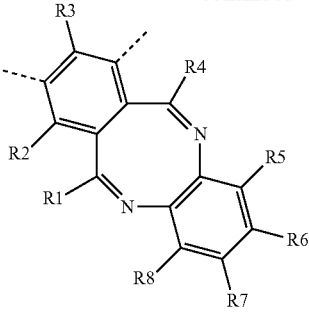

wherein:
the dashed bonds represent the main polymer chain;
$R_1$-$R_8$ are independently selected from the group consisting of H, alkyl, substituted alkyl, aryl, substituted aryl, heteroaryl, substituted heteroaryl, halogen, —CN, —CHO, —COR$_a$, —CR$_a$=NR$_b$, —OR$_a$, —SR$_a$, —SO$_2$R$_a$, —PO-R$_a$R$_b$, —PO$_3$R$_a$, —OCOR$_a$, —CO$_2$R$_a$, —NR$_a$R$_b$, —N=CR$_a$R$_b$, —NR$_a$COR$_b$, —CONR$_a$R$_b$ in which R$_a$ and R$_b$ are independently selected from the group consisting of H, alkyl, substituted alkyl, aryl, substituted aryl, heteroaryl, and substituted heteroaryl and two or more of $R_1$-$R_8$, R$_a$, and R$_b$ may or may not be linked to form a ring structure;
Ar and Ar' are divalent aromatic units including but not limited to 1,2-phenylene, 1,4-phenylene, substituted 1,2-phenylene, substituted 1,4-phenylene, 4,4'-biphenylene, substituted 4,4'-biphenylene, 4,4''-terphenylene, substituted 4,4''-terphenylene, 1,4-naphthylene, substituted 1,4-naphthylene, 2,6-naphthylene, substituted 2,6-naphthylene, 2,7-fluorenylene, substituted 2,7-fluorenylene, 2,6-anthracenylene, substituted 2,6-anthracenylene;
9,10-anthracenylene, and substituted 9,10-anthracenylene.

Among all these possible groups D, those where the substituents $R_1$ to $R_8$ linked to the benzo rings are H are very preferred, essentially for reasons of accessibility. Groups D, where the substituents $R_1$ to $R_8$ linked to the benzo rings are functional groups capable of polymerization are also encompassed within the scope of the invention. Further, groups D where the nitrogen atoms are in the 1,5 positions in the diazocine ring are also very preferred, essentially for the same reasons.

Also, among these preferred groups D including Ar units or Ar and Ar' units, those where Ar and Ar' units are 1,4-phenylene are also very preferred.

The group D of the following formula:

(D1)

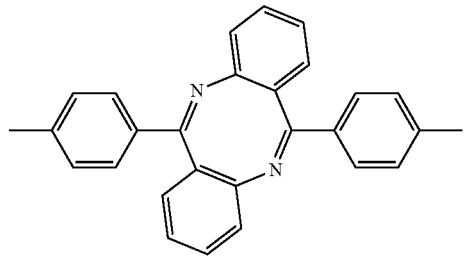

is especially preferred.
The Divalent Group Ar$_b$
In the recurring units (A) of the copolymers (C), Ar$_b$ is selected among $C_6$-$C_{50}$ arylene groups and $C_{12}$-$C_{50}$ aromatic hydrocarbon groups of formula (I) as set forth above.

Non limitative examples of $C_6$-$C_{50}$ arylene groups suitable as divalent group $Ar_b$ include:

| | |
|---|---|
| 1,4-phenylene (also named p-phenylene) | 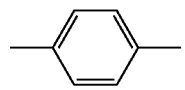 |
| 1,4-naphthylene | 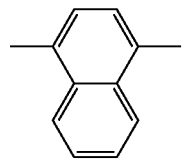 |
| 1,4-phenanthrylene and 2,7-phenanthrylene | 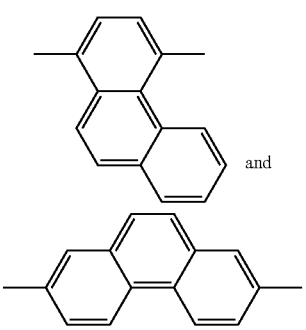 and |
| 1,4-anthrylene and 9,10-anthrylene | 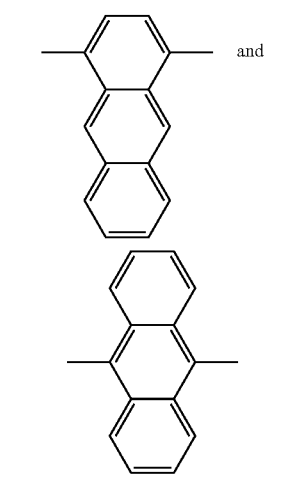 and |
| 2,7-pyrenylene | 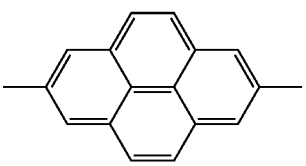 |
| 1,6-coronenylene | 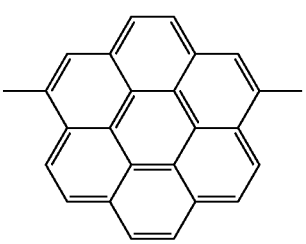 |
| 2,6-naphthylene | 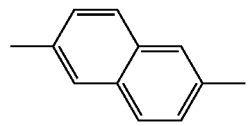 |
| 2,6-anthrylene | 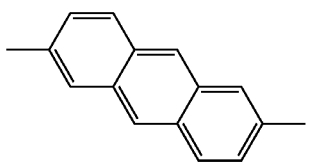 |
| 1,3-phenylene | 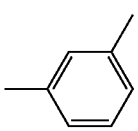 |
| 1,3- and 1,6-naphthylenes | 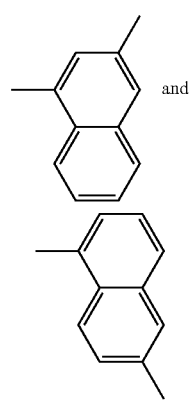 and |

Among all $C_6$-$C_{50}$ arylene groups suitable as divalent group $Ar_b$, p-phenylene, 1,4-naphthylene, 2,7-phenanthrylene and 2,7-pyrenylene are preferred; p-phenylene is the most preferred.

$C_{12}$-$C_{50}$ aromatic hydrocarbon groups of formula (I) are generally preferred as divalent groups $Ar_b$ in the recurring units (A) of the copolymers in accordance with the invention.

In formula (I), the unassigned positional isomer may be meta to Q, such as in 3,4'-biphenylene (wherein Q is a direct covalent bond), and in its homologous wherein the direct covalent is replaced by a sulfone unit [—S(=O)$_2$—], a ketone unit [—C(=O)—] or a isopropylidene unit.

Yet, the unassigned positional isomer is preferably para to Q.

Certain $C_{12}$-$C_{50}$ aromatic hydrocarbon groups of formula (I) wherein the unassigned positional isomer is para to Q, which are suitable as divalent groups $Ar_b$, are of the general formula:

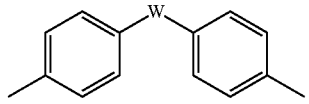

wherein W is selected among the following structures:

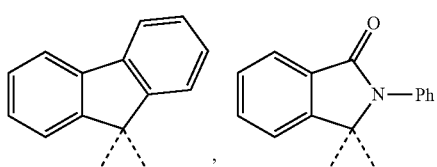

where Ph is phenyl

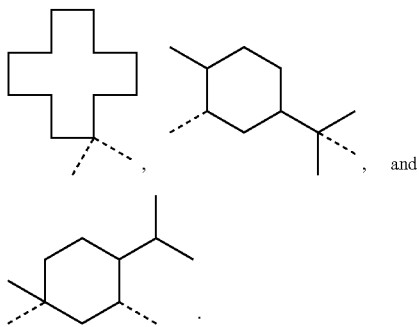

Other examples of $C_{12}$-$C_{50}$ aromatic hydrocarbon groups of formula (I) wherein the unassigned positional isomer is para to Q, which are suitable as divalent groups $Ar_b$ include:

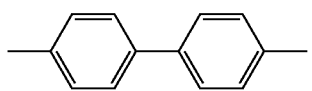 (i)

(Q is a direct covalent bond),

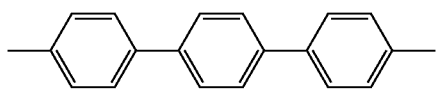 (ii)

(Q is p-phenylene),

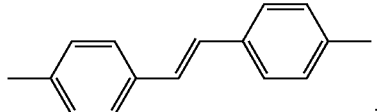 (iii)

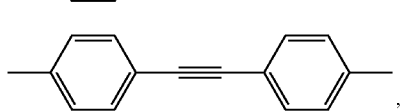 (iv)

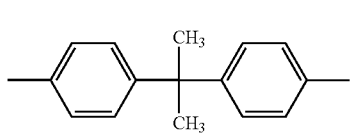 (v)

(Q is isopropylidene),

 (vi)

with R being a $C_1$-$C_6$ alkylene other than isopropylidene, a $C_1$-$C_6$ partially fluorinated alkylene, or a $C_1$-$C_6$ perfluorinated alkylene such as

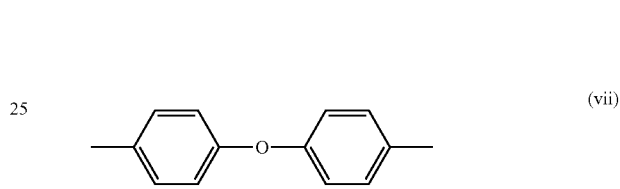

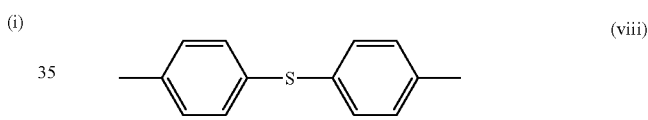 (vii)

(Q is oxygen),

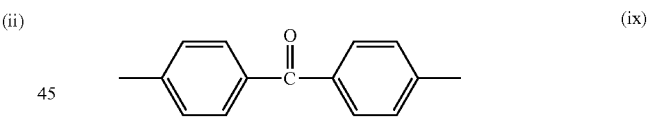 (viii)

(Q is sulfur),

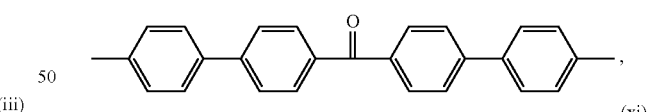 (ix)

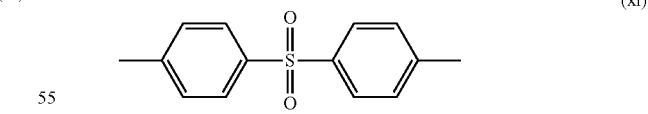 (x)

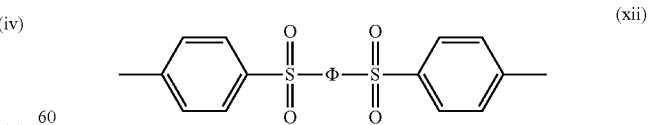 (xi)

(xii)

wherein, in the last above formula, Φ is a divalent group comprising at least one $C_6$-$C_{38}$ arylene unit, said $C_6$-$C_{38}$ arylene unit being preferably chosen among above listed structures (i), (ii), (iii), (iv), (v), (vi), (vii), (viii), (ix) and (xi), and mixtures of any of formulae (i) to (xii).

As divalent group $Ar_b$, the following groups of general formula (I) are preferably used:

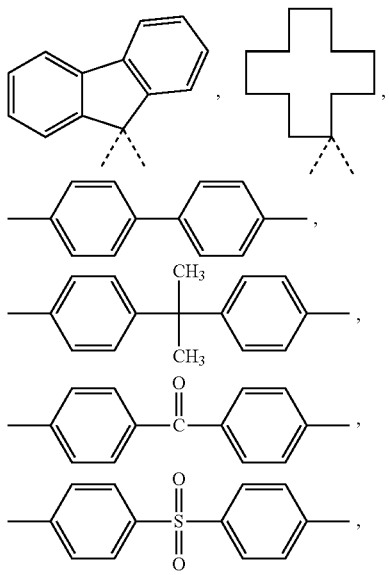

and mixtures thereof.

As divalent group $Ar_b$, the most preferred group of general formula (I) is p-biphenylene

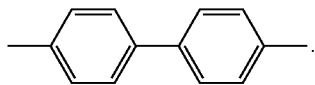

Referring to $Ar_b$, the term "at least one" means that, in an indifferent manner, all the recurring units (A) may include as group $Ar_b$ the same divalent group, or different recurring units (A) may include as group $Ar_b$ divalent groups having different formulae.

The copolymers (C) in accordance with the invention further comprise (—$Ar_a$-G-$Ar_b$-G-) recurring units, which are also defined in the present description, for the sake of brevity, as "recurring units (B)".

The recurring units (B) of the copolymers (C) also comprise at least one $Ar_b$ group, as the recurring units (A) described above. Accordingly, the definitions and limitations set forth for these groups in the description of recurring units (A) equally apply to the description of the recurring units (B).

In particular, referring to $Ar_b$, the term "at least one" means that, in an indifferent manner, all the recurring units (B) may include as group $Ar_b$ the same divalent group, or different recurring units (B) may include as group $Ar_b$ divalent groups having different formulae.

The Divalent Group $Ar_a$

The recurring units (B) of the copolymers (C) in accordance with the invention further comprise a divalent group $Ar_a$, which is at least one dibenzodiazocine-free divalent group selected among divalent groups (GS) and divalent groups (GK). For the purpose of the present description, the term "at least one" means that, in an indifferent manner, all the recurring units (B) may include as group $Ar_a$ the same divalent group, or different recurring units (A) may include as group $Ar_a$ divalent groups having different formulae. For example, $Ar_a$ may be a single divalent group selected among divalent groups (GS), or $Ar_a$ may be a single divalent group selected among divalent groups (GK), or $Ar_a$ may be a mixture of at least two divalent groups selected among divalent groups (GS), or $Ar_a$ may be a mixture of at least two divalent groups selected among divalent groups (GK), or $Ar_a$ may be a mixture of at least one divalent group selected among divalent groups (GS) with at least one divalent group selected among divalent groups (GK).

In a first embodiment (E1), the divalent group $Ar_a$ is at least one dibenzodiazocine-free divalent group selected among $C_{12}$-$C_{50}$ divalent groups (GS) containing at least one sulfone unit [—$S(=O)_2$—] and at least two $C_6$-$C_{40}$ arylene units.

Divalent groups (GS) include usually a 4,4'-diphenyl sulfone unit of formula

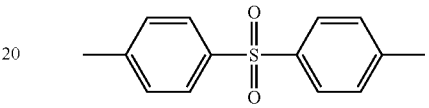

In a particular sub-embodiment of (E1), the divalent groups (GS) are sulfoneimide groups. For the purpose of the present invention, a sulfoneimide group is intended to denote a group containing at least one sulfone unit and at least one imide unit, as such and/or in its amic acid form. Preferred sulfoneimide groups are of one or more of the following formulae:

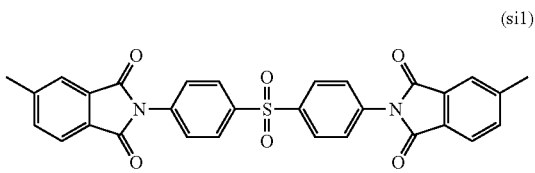

(si1)

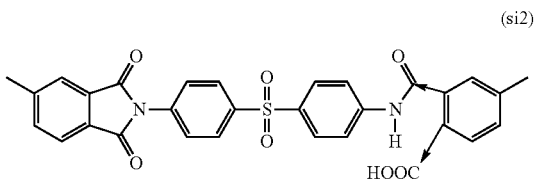

(si2)

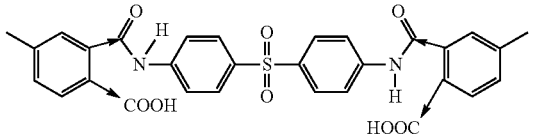

(si3)

wherein:

(si2) and (si3) are the amic acid forms corresponding to the imide form (si1);

the → denotes isomerism so that the groups to which the arrows point may exist as shown or in an interchanged position;

Divalent groups (GS) suitable for use as $Ar_a$ in accordance with embodiment (E1) of the present invention are preferably selected from the above sulfoneimide groups (si1), (si2) and (si3),

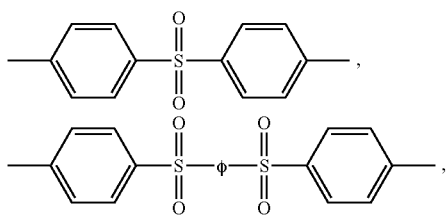

and mixtures thereof,
wherein, in the last above formula, Φ is a divalent group comprising at least one $C_6$-$C_{38}$ arylene unit, said $C_6$-$C_{38}$ arylene unit being preferably chosen among

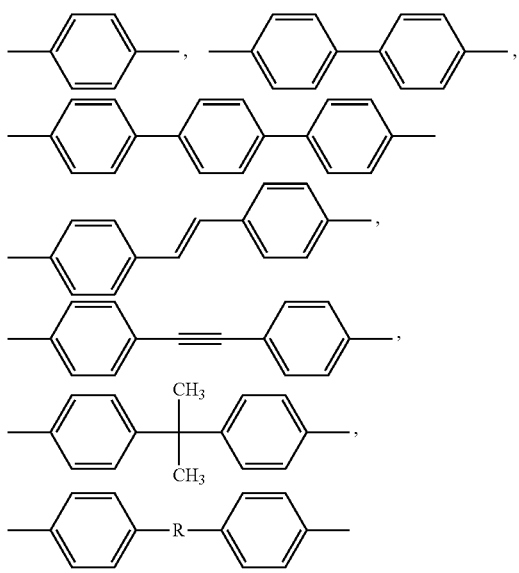

where R is a $C_1$-$C_6$ alkylene other than isopropylidene, a $C_1$-$C_6$ partially fluorinated alkylene, or a $C_1$-$C_6$ perfluorinated alkylene such as perfluoroisopropylidene,

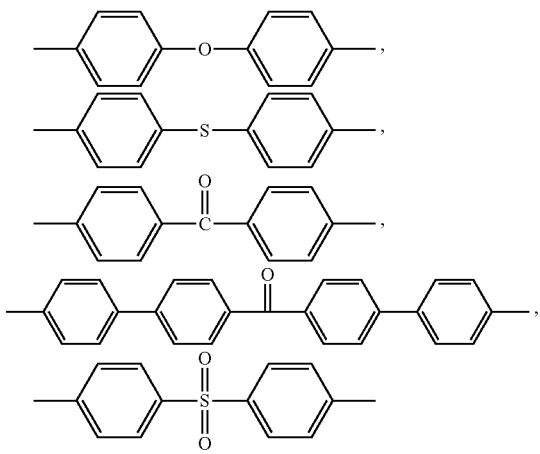

and mixtures thereof.

Very preferably, divalent groups (GS) suitable for use as $Ar_a$ in accordance with embodiment (E1) of the present invention are selected from:

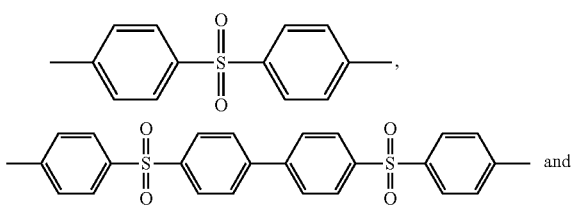

mixtures thereof.

Among all divalent groups (GS), the divalent group

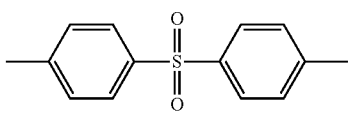

is the most preferred for use as divalent group $Ar_a$ in accordance with embodiment (E1) of the present invention.

In another embodiment (E2), the divalent group $Ar_a$ is at least one dibenzodiazocine-free divalent group selected among $C_{12}$-$C_{50}$ divalent groups (GK) containing at least one ketone unit [—C(═O)—] and at least two $C_6$-$C_{40}$ arylene units.

Divalent groups (GK) include generally a 4,4'-benzophenone unit of formula

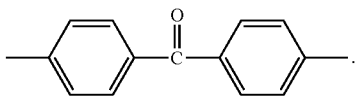

Divalent groups (GK) suitable for use as $Ar_b$ in accordance with embodiment (E2) of the present invention are preferably selected from the group consisting of:

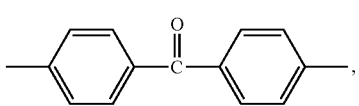

-Phi-C(═O)-Π-C(═O)-Phi-, and mixtures thereof, wherein, in the last above formula, Phi is para-phenylene and Π is a divalent group comprising at least one $C_6$-$C_{36}$ arylene unit, chosen among

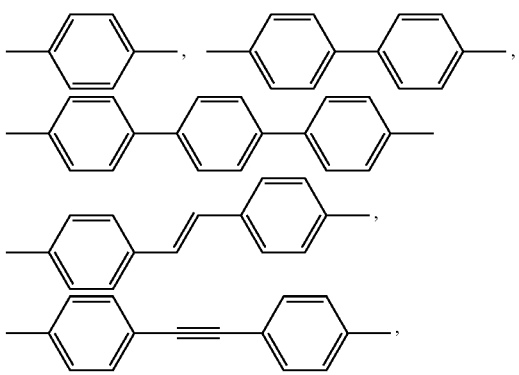

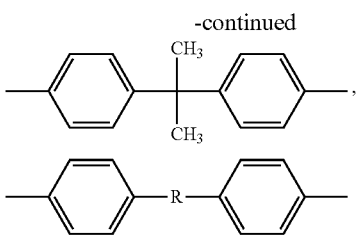

where R is a $C_1$-$C_6$ alkylene other than isopropylidene, a $C_1$-$C_6$ partially fluorinated alkylene, or a $C_1$-$C_6$ perfluorinated alkylene such as perfluoroisopropylidene,

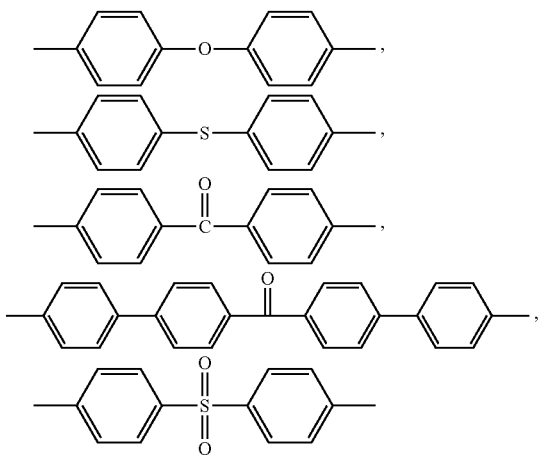

and mixtures thereof.

Divalent groups (GK) suitable for use as $Ar_b$ in accordance with embodiment (E2) of the present invention are preferably selected from:

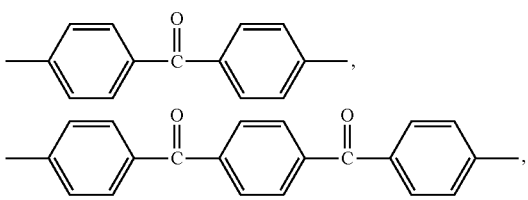

-Phi-C(=O)-$\Pi_1$-C(=O)-Phi- where $\Pi_1$ is

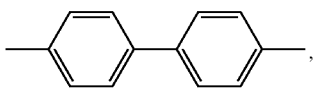

Phi-C(=O)-$\Pi_2$-C(=O)-Phi- where

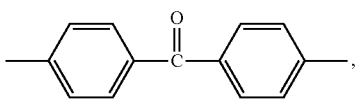

$\Pi_2$ is Phi-C(=O)-$\Pi_3$-C(=O)-Phi- where $\Pi_3$ is

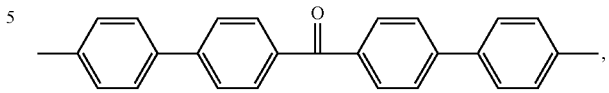

and mixtures thereof.

Among all divalent groups (GK), the divalent group

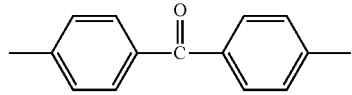

is the most preferred for use as divalent group $Ar_b$ in accordance with embodiment (E2) of the present invention.

The most preferred copolymers (C) are those the recurring units of which consist essentially of:
recurring units (A) wherein D is a divalent group of the formula (D1)

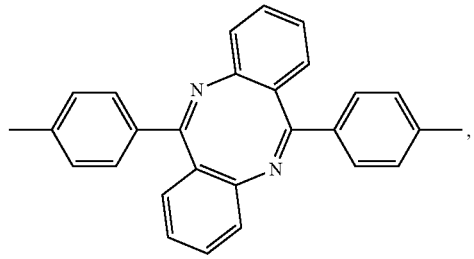

$Ar_b$ is

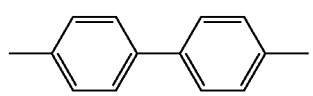

and the G contained in the recurring units (A) are ether groups (—O—), and
recurring units (B) wherein $Ar_a$ is selected from

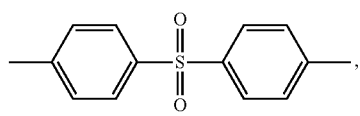

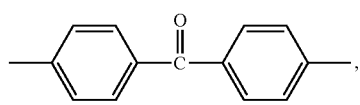

and mixtures thereof, and the G contained in the recurring units (B) are ether groups (—O—),
wherein the respective amounts of recurring units (A) and (B) in the copolymers (C) in accordance with the invention, expressed by their molar ratios (A):(B) generally vary from 1:99 to 99:1, especially from 10:90 to 90:10, and preferably either from 10:90 to 30:70 and 40:60 to 60:40.

The Divalent Group G

The recurring units (A) and the recurring units (B) of the copolymers (C) in accordance with the invention further comprise at least one divalent group G.

Each group G may indifferently be an ether group or a thioether group or a mixture thereof.

For example, when recurring units (A) of the copolymers (C) are of the general structural formula -D-G-$Ar_b$-G-, said recurring units (A) may be notably:

-D-O—$Ar_b$—O—, or
-D-O—$Ar_b$—S—, or
-D-S—$Ar_b$—O—, or
-D-S—$Ar_b$—S—, or
a mixture of -D-O—$Ar_b$—O— and -D-O—$Ar_b$—S—, or
a mixture of -D-O—$Ar_b$—O— and -D-S—$Ar_b$—O—, or
a mixture of -D-O—$Ar_b$—O—, -D-O—$Ar_b$—S— and -D-S—$Ar_b$—O—.

Preferably, each G is an ether group (—O—).

Copolymers (C) provided in accordance with the present invention generally feature glass transition temperatures ($T_g$) (conventionally measured by differential scanning calorimetry, DSC) higher than 200° C., preferably higher than 215° C. and which can even exceed 245° C. The weight average molecular weight ($M_w$) (conventionally measured by gas permeation chromatography, GPC (relative to polystyrene standards)) of the copolymers (C) is generally higher than $5 \times 10^3$, preferably higher than $10 \times 10^3$, and more preferably higher than $20 \times 10^3$. This weight average molecular weight ($M_w$) is generally lower than $10000 \times 10^3$, preferably lower than $100 \times 10^3$, and more preferably lower than $60 \times 10^3$. The number average molecular weight ($M_n$) (conventionally measured by selective elution chromatography, SEC with the end group analysis using the integrations from the $^1$H-NMR spectrum) of the copolymers (C) is generally is generally higher than $5 \times 10^3$, preferably higher than $10 \times 10^3$, and more preferably higher than $20 \times 10^3$. This number average molecular weight ($M_n$) is generally lower than $5000 \times 10^3$, preferably lower than $70 \times 10^3$, more preferably lower than $50 \times 10^3$.

As to their overall structure, copolymers (C) in accordance with the invention may be linear, branched, hyperbranched, dendritic, random, block or any combinations thereof. The order of the recurring units (A) and (B) units in the structure of copolymer (C) in accordance with the invention is not critical. Copolymers (C) may be blocky, e.g. with a structure identical to or substantially equal to -AAAAAABBBBBB-; copolymers (C) may have an alternate structure, e.g.-ABA-BABABABABAB-; the recurring units (A) and (B) of the copolymers (C) may be randomly distributed, e.g. in a -AA-BABBBABBAAA- like structure.

The Invented Method of Preparation

In another of its aspects, the invention also relates to a method for the preparation of copolymers, which is especially well suited for the preparation of the copolymers (C) as above described.

Accordingly, the present invention further relates to a method for preparing copolymers, in particular the copolymers (C) as above described, which comprises synthesizing said copolymers via step-growth polymerization involving nucleophilic displacement reactions between:
at least one difunctional monomer (M1) comprising a divalent group D, of general formula X-D-X,
at least one difunctional monomer (M2) comprising a divalent group $Ar_a$, of general formula X—$Ar_a$—X, and
at least one difunctional monomer (M3) comprising a divalent group $Ar_b$, of general formula H-G-$Ar_b$-G-H, wherein:

each H is a hydrogen atom;

each X is at least one divalent group selected from halogen atoms, nitro groups and mixtures thereof; X is preferably selected from halogen atoms, and X is very preferably a fluorine atom; the X are independently chosen from each other; and D, $Ar_a$, $Ar_b$ and G are as previously defined when referring to the copolymers (C); advantageously, D, $Ar_a$, G and $Ar_b$ comply with the same limitations and preferences, as those set forth in the description of the copolymers (C).

The difunctional monomer (M1) is generally selected among one or more of the following monomers:

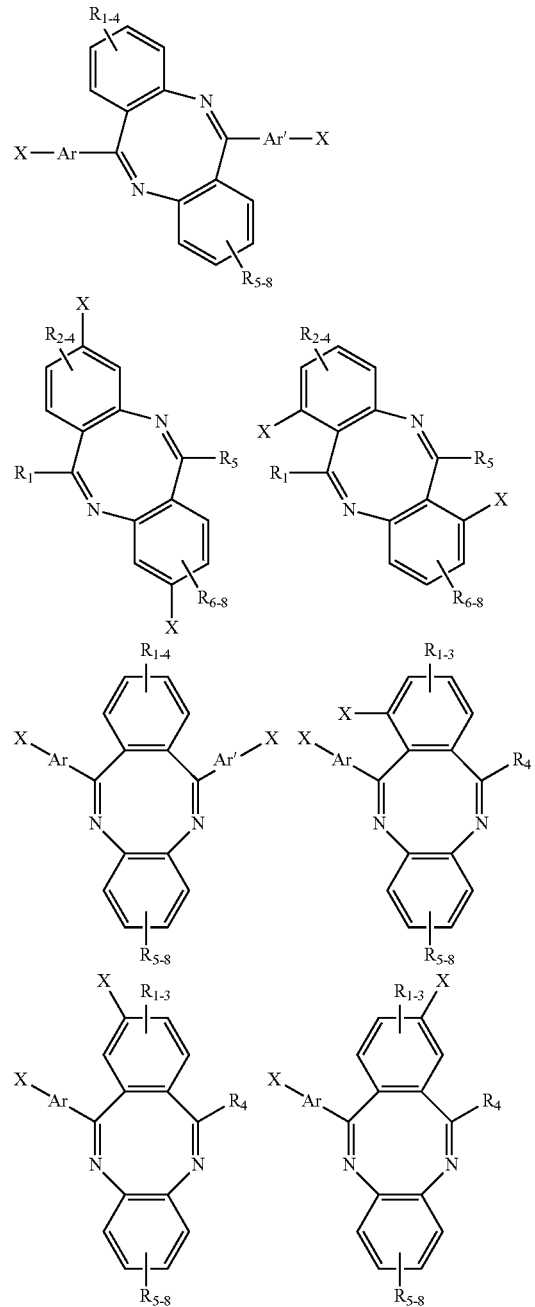

-continued

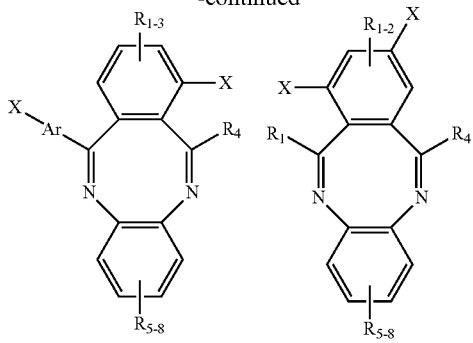

wherein:

Ar, Ar', and $R_1$-$R_8$ have the same meanings and limitations as their counterparts in the definition of the groups D in the description of the copolymers (C).

Among all these difunctional monomers (M1), those where the substituents $R_1$ to $R_8$ linked to the benzo rings are H, and where the aromatic units Ar and Ar' are 1,4-phenylene, are preferred, essentially for reasons of accessibility.

Monomers (M1) of formulae (M11) and (M12) are especially preferred, most particularly the monomer of formula (M11) where each X is fluorine.

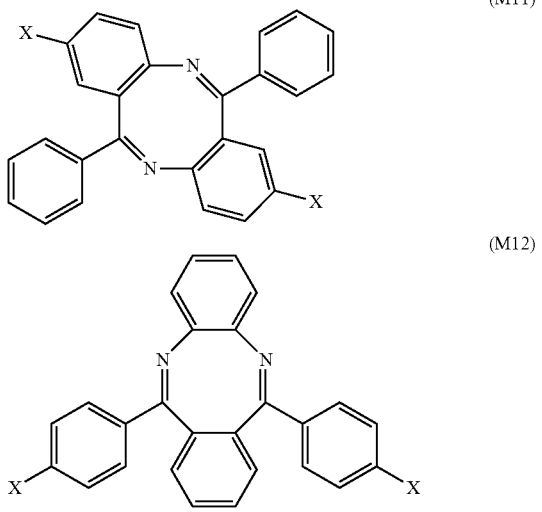

The difunctional monomer (M2) is generally selected among one or more of the following monomers:

monomers (M21) where $Ar_a$ is at least one dibenzodiazocine-free divalent group selected among $C_{12}$-$C_{50}$ divalent groups (GS) containing at least one sulfone unit [—S(=O)$_2$—] and at least two $C_6$-$C_{40}$ arylene units;

monomers (M22) where $Ar_a$ is at least one dibenzodiazocine-free divalent group selected among selected among divalent groups (GK) containing at least one ketone unit [—C(=O)—] and at least two $C_6$-$C_{40}$ arylene units;

mixtures of these monomers (M21) and (M22).

Among difunctional monomers (M21), functionalized aryl dihalides containing a sulfone group may be cited. Examples of functionalized aryl dihalides containing a sulfone group are the halogenated derivatives of diphenylsulfones. Examples of halogenated derivatives of diphenylsulfones are di-(4-fluoro-phenyl)sulfone and di-(4-chloro) phenyl)sulfone. Di-(4-fluoro-phenyl)sulfone may be preferred as monomer (M21).

Among difunctional monomers (M22), functionalized aryl dihalides containing a ketone group may be cited. Examples of functionalized aryl dihalides containing a ketone group are the halogenated derivatives of benzophenones. Examples of halogenated derivatives of benzophenone are 4,4'-difluoro-, 4,4'-dibromo- and 4,4'-dichlorobenzophenone. 4,4'-difluorobenzophenone may be preferred as monomer (M22).

The difunctional monomer (M3) is generally selected among one or more the following bisphenols and/or corresponding dithiols or phenol-thiols: 4,4'-biphenol; hydroquinone; 4,4'-dihydroxybiphenyl; resorcinol; dihydroxynaphthalene (2,6 and other isomers); 4,4'-dihydroxydiphenyl ether or -thioether; 4,4'-dihydroxybenzophenone; 2,2'-di-(4-hydroxyphenyl)-propane (bisphenol A) or -methane; 4,4'-oxybis(phenol); and hexafluoroisopropylidene diphenol. 4-4'-biphenol may be preferred as monomer (M3).

The general conditions under which the three difunctional monomers have to be contacted to achieve the step-growth polymerization involving the necessary nucleophilic displacement reactions are not critical and their principles well known in the art of condensation polymerization processes. The at least three monomers may be contacted together in any order. They are generally mixed together in an organic liquid medium, which most often contain a solvent selected among tetrahydrofurane, (THF), N,N-dimethylformamide (DMF), N,N-dimethylacetamide (DMAc), N-methyl-2-pyrrolidone, diphenylsulfone, toluene and the like, in the conventional presence of an alkaline metal salt like, for instance, potassium or sodium carbonate. The polymerization temperature is generally higher than 80° C., preferably higher than 120° C., more preferably higher than 140° C. The polymerization is generally carried out for a duration exceeding one hour, and the duration of the polymerization may exceed 10 hours.

The respective amounts of monomers (M1 to (M3) are selected, taking their respective reactivity into account, for instance by some preliminary tests, in order to obtain copolymers, especially copolymers (C), comprising the respective amounts of recurring units (A) and (B) as defined above. It is preferred to control stoechiometrically the composition ratio of the D groups with the feed ratio of the corresponding difunctional monomers (M1) and (M2).

The copolymers may be advantageously end-capped by adding an end-capping agent to the polymerization mixture. Non limitative examples of suitable end-capping agents are t-butylphenol and 4-hydroxybiphenyl.

The Invented Polymer Compositions

Still another aspect of the present invention concerns polymer compositions containing at least one copolymer chosen among the copolymers (C) as above described and the copolymers prepared by the method as above described, and one or more ingredient(s) other than said at least one copolymer.

Said other ingredient(s) can be selected notably among conventional ingredients of poly(aryl ether sulfone)s and/or poly(aryl ether ketone)s compositions, include light stabilizers (e.g., 2-hydroxybenzophenones, 2-hydroxyphenylbenzotriazoles, hindered amines, salicylates, cinnamate derivatives, resorcinol monobenzoates, oxanilides, p-hydroxybenzoates, and the like); plasticizers (e.g. phthalates, and the like); dyes, colorants, organic and/or inorganic pigments (e.g., $TiO_2$, carbon black and the like); flame retardants (e.g., aluminum hydroxide, antimony oxides, boron compounds, bromine compounds, chlorine compounds, and the like); antistatic additives; biostabilizers; blowing agents; adhesion promoters; compatibilizers; curing agents; lubricants; mold release agents; smoke-suppressing agents; heat stabilizers; antioxidants; UV absorbers; tougheners such as rubbers; anti-static agents; acid scavengers (e.g., MgO and the like); melt viscosity depressants (e.g., liquid crystalline polymers, and the like); processing aids; anti-static agents; extenders; reinforcing agents, fillers, fibrous fillers such as glass fibers and carbon fibers, acicular fillers such as wollastonite, platty fillers, particulate fillers and nucleating agents such as talc, mica, titanium dioxide, kaolin and the like, and mixtures thereof.

Additionally, it is envisioned, within the scope of the invention, to blend include in the presently invented compositions engineering polymers other than copolymers (C), notably: poly(aryl ether sulfone)s like poly(biphenyl ether sulfone)s, poly(ether sulfone)s and bisphenol A polysulfones; poly(aryl ether ketone)s like poly(ether ether ketone)s, poly(ether ketone)s and poly(ether ketone ketone)s; polyetherimides (e.g., ULTEM®-type and AURUM®-type polymers); polyamideimides (e.g., TORLON®-type polymers), polyphenylenes (e.g., PRIMOSPIRE™), polyimides, polyamides such as polyphthalamides, polyesters, polycarbonates such as bisphenol A polycarbonates, polyureas, liquid crystalline polymers, polyolefins, styrenics, polyvinylchloride, phenolics, polyethylene terephthalates, acrylics and the like.

The weight of said optional ingredient(s), based on the total weight of the invented polymer compositions, may be of at least 1%, 2%, 5%, 10%, 20%, 30%, 40%, 50% or even more. On the other hand, it may be of at most 50%, 40%, 30%, 20%, 10%, 5%, 2% or 1%. Good results were obtained when the invented polymer compositions consisted essentially of, or even consisted of, the copolymers (C). Good results can also be obtained with fiber-filled polymer compositions comprising at least one copolymer chosen among the copolymers (C) as above described and the copolymers (C) prepared by the method as above described, and one or more fibrous fillers, wherein the weight amount of fibrous filler, based on the total weight of the polymer composition, ranges usually from 5 wt. % to 30 wt. %.

The invented polymer compositions are advantageously prepared by any conventional mixing method. A certain method comprises dry mixing the ingredients of the invented polymer compositions of concern in powder or granular form, using e.g. a mechanical blender, then extruding the mixture into strands and chopping the strands into pellets.

The Invented Shaped Articles and Shaped Parts of Articles

Still another aspect of the present invention concerns shaped articles or shaped parts of articles containing either the polymer compositions as above described, or at least one copolymer chosen among the copolymers (C) as above described and the copolymers (C) prepared by the method as above described.

Indeed, the outstanding balance of advantageous properties featured by the inventive copolymers (C) in connection with their high glass transition temperature, thermal stability, flame resistance, chemical resistance and melt processability, makes them particularly suitable for the manufacture, by any known processing method, of devices such as radios, television sets and computers and electrical wiring coating. Furthermore, the copolymers of the present invention can be used as dielectrics in various electronic and optoelectronic applications including but not limited to printing wiring boards, semiconductors, and flexible circuitry. Additionally, the copolymers (C) can be used in various electronic adhesive applications including but not limited to lead-frame adhesives and also in aircraft interior applications. Other applications of the copolymers (C) in accordance with the invention comprise electromechanical actuating devices; medical devices; sensing devices; applications requiring use temperature up to 200° C., even up to 250° C. and more; free-standing films; fibers; foams; medical implements, nonwoven fibrous materials; separation membranes (such as gas separation membranes), semi-permeable membranes; ion exchange membranes; fuel cell devices; photoluminescent or electroluminescent devices, etc.

Structural Variations Around Copolymers (C)—Other Copolymers in Accordance with Present Invention Still another aspect of the present invention concerns copolymers (C') comprising recurring units (A) and (B), said copolymers (C') being identical to the copolymers (C) as above defined, except that:

the recurring units (A) of the copolymers (C') are of one or more of the general structural formulae:

-D-G-$Ar_b$-G-, -G-D-G-$Ar_b$- and/or -D-G-, and the recurring units (B) of the copolymers (C') are of one or more of the general structural formulae:

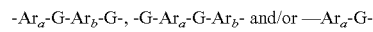
-$Ar_a$-G-$Ar_b$-G-, -G-$Ar_a$-G-$Ar_b$- and/or —$Ar_a$-G- wherein D, G, $Ar_a$ and $Ar_b$ are as above defined for the copolymers (C).

Recurring units of the general structural formula -G-D-G-$Ar_b$- can be obtained notably by nucleophilic displacement reaction between at least one dihydroxydibenzodiazocine of general formula HO-D-OH, on one hand, and at least one dihalocompound of general formula X—$Ar_b$—X, wherein X is a halogen atom (in particular, fluorine), on the other hand. The corresponding dithiol-dibenzodiazocine HS-D-SH can also be used in partial or complete replacement of the dihydroxydibenzodiazocine HO-D-OH.

Recurring units of the general structural formula -D-G- can be obtained notably by a nucleophilic displacement reaction involving at least one monohalogeno- monohydroxy- dibenzodiazocine-containing compound of general formula X-D-OH, wherein X is a halogen atom (in particular, a fluorine atom); the corresponding thiol X-D-SH can also be used in partial or complete replacement of the alcohol X-D-OH. X-D-OH can notably react with itself, and/or with a diol such as HO—$Ar_b$—OH, and/or with a thiol such as HO—$Ar_b$—OH, and/or with a dihalocompound such as X—$Ar_a$—X, and/or with a monohalogeno-monohydroxy-compound such as X—$Ar_a$—OH or X—$Ar_a$—SH.

Recurring units of the general structural formula -G-$Ar_a$-G-$Ar_b$- can be obtained notably by nucleophilic displacement reaction between at least one diol of general formula HO—$Ar_a$—OH, on one hand, and at least one dihalocompound of general formula X—$Ar_b$—X, wherein X is a halogen atom (in particular, fluorine), on the other hand; the corresponding dithiol HS—$Ar_a$—SH can also be used in partial or complete replacement of the diol HO—$Ar_a$—OH.

Recurring units of the general structural formula —$Ar_a$-G- can be obtained notably by a nucleophilic displacement reaction involving at least one monohalogeno- monohydroxy-containing compound of general formula X—$Ar_a$—OH, wherein X is a halogen atom (in particular, a fluorine atom); the corresponding thiol X—$Ar_a$—SH can also be used in partial or complete replacement of the alcohol X—$Ar_a$—OH. X—$Ar_a$—OH can notably react with itself, and/or with a diol such as HO—$Ar_b$—OH, and/or with a thiol such as HO—$Ar_b$—OH, and/or with a dihalocompound such as X—$Ar_a$—X, and/or with a monohalogeno-monohydroxy-compound such as X—$Ar_a$—OH or X—$Ar_a$—SH.

As examples of recurring units —Ar$_a$-G-, it can be cited

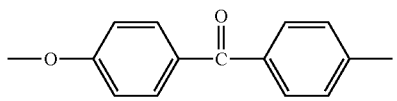

[etherketone type units, obtainable by a nucleophilic reaction involving (4-fluorobenzoyl)phenol], and

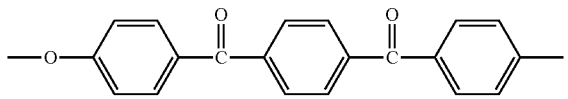

[etherketoneketone type units].

Except when they are incompatible, all the possible limitations and preferences above detailed concerning the nature and amount of the copolymers (C), their recurring units (A) and (B), the divalent groups D, G, Ar$_a$ and Ar$_b$ contained therein, the optional recurring units (Z) of the copolymers (C), the compositions made of the copolymers (C), and the shaped articles and parts of articles made of the copolymers (C), can be applied mutatis mutandis to the present copolymers (C'), their recurring units (A) and (B), the divalent groups D, G, Ar$_a$ and Ar$_b$ contained therein, the optional recurring units (Z) of the copolymers (C'), the compositions made of the copolymers (C'), and the shaped articles and parts of articles made of the copolymers (C').

Provided below are examples illustrative of the present invention, but not limitative thereof.

EXAMPLES

Examples 1, 2, 3, 4, 5R and 6R

The examples 5R and 6R are given for comparison purposes.

A. Preparation of the (6,12-bis(4-fluorophenyl)dibenzo[b,f][1,5] diazocine) monomer (M1)

In a 1 L 3-neck round-bottom flask fitted with an overhead stirrer, Barrett trap, condenser, and nitrogen inlet, was placed 250 g 2-amino-4'-fluoro-benzophenone (purchased from Unibest, China), 12.2 g p-toluenesulfonic acid-hydrate (TsOH—H$_2$O), and 300 ml xylenes. The mixture was stirred under a slight nitrogen pressure and warmed to reflux while collecting the by-product water in the Barrett trap. After seven hours, about 24 ml water had been collected. The dark reaction mixture was cooled to about 100° C. and slowly poured into a large excess of methanol to give a yellow solid. The solid was collected by filtration and washed twice with methanol. The solid was then soaked in methanol for 16 hours, filtered, and washed with warm methanol. The solid was recrystallized from methylene chloride/methanol (1:1 vol.) to give 182 g of a bright yellow solid, referred to as difluorodibenzodiazocine (Melting point (DSC)=196° C., Purity: 99.5% (GPC, % area). IR spectroscopy (ATR): 960, 935 cm$^{-1}$ (indicative of diazocine ring)).

B. General Conditions of the Preparation of Copolymers (C)

The copolymers (C) were prepared by a condensation polymerization method: difluorodibenzodiazocine was mixed with either dichlorodiphenylsulfone (DCDPS) or difluorobenzophenone (DFBP) along with a 1-2% wt. excess of bisphenol and a ~2-5% wt. excess of finely-ground and dried potassium carbonate (K$_2$CO$_3$) in a solvent mixture of N,N-dimethylacetamide (DMAc) and toluene. The target copolymer concentration in DMAC was approximately 15 wt %. Gaseous methyl chloride was added to the reaction mixture at the end of the polymerization to react with the potassium-phenate salts at one or both ends of the polymer chains to form terminal —OCH$_3$ groups. Other chain ends presumably consist of —F, or —Cl. The terminated reaction mixture was filtered to remove insoluble potassium salts to give a clear, viscous solution. The copolymers were isolated by pouring the filtered solution in to a large excess of methanol or water to form a fibrous solid which was washed with methanol and then dried thoroughly in an oven to ensure removal of residual DMAc. Small, clear films (1-3 mil thick) were cast from 10-20% solutions of the polymers in THF or DMAc and dried.

Portions of the dried powders or films were tested by DSC to determine the glass transition temperature (T$_g$). GPC was used to estimate the average molecular weight, and TGA (under nitrogen) used to determine the onset temperature of thermal degradation (T$_{onset}$) and the amount of residue remaining at 800° C. (% char).

Following are examples of the preparation of the copolymers.

Example 1

Preparation of a Dibenzodiazocine-Sulfone Bisphenol a Copolymer

In a 4-neck, 500-ml flask, fitted with an overhead stirrer, Barrett trap, nitrogen inlet, and condenser, was placed 14.17 g (0.06207 moles) bisphenol A, 8.74 g (0.03043 moles) DCDPS, 12.00 g (0.03042 moles) difluorodibenzodiazocine, and 9.01 g (0.0652 moles) of finely ground potassium carbonate under a nitrogen atmosphere. Next, 200 ml N,N-dimethylacetamide (DMAc) and 55 ml toluene were added and the contents stirred and warmed to 145-147° C. using an oil bath. The water by-product was collected in the Barrett trap water as an azeotrope with the toluene. After five hours, the trap was drained and the reaction mixture stirred at 157-159° C. for 16 hours. The reaction vessel was raised up from the oil bath and methyl chloride added slowly (at approximately 0.5 g/min) to the stirring reaction mixture through a stainless steel diptube inserted below the reaction liquid level. After 20 minutes, the methyl chloride addition was stopped and the reaction mixture purged with nitrogen for an additional 20 minutes. The viscous mixture was filtered through a 2.7 µm glass fiber filter in a pressure vessel to give a clear light yellow liquid. The reaction vessel was rinsed with an additional 40 ml DMAc, and the rinsate filtered through the same filter and into the original filtrate. A portion of the solution was poured in to a beaker containing methanol under vigorous agitation to give a fibrous pale yellow solid. This solid was filtered, washed with fresh methanol, and then dissolved in THF. The THF polymer solution was then poured in to fresh methanol under vigorous stirring to give a pale yellow solid. The solid was washed with warm methanol and then dried in a vacuum oven at 80° C. for four hours and then in a convection oven for an additional four hours at 200° C.

The glass transition temperature was determined to be 229° C. according to DSC. The weight-average molecular weight, as determined by GPC and relative to polystyrene standards, was 53,790 Daltons. TGA measurements under nitrogen indicated an onset of degradation at 498° C. with a residue at 800° C. of 48%. The polymer was freely soluble in chloroform, methylene chloride, THF, DMAc, and NMP. A 35 μm thick film cast from THF was transparent and flexible.

Examples 2-4

Example 1 was reproduced except that different ratios of dibenzodiazocine/DCDPS were used. The polymers were characterized and the results summarized in Table I where the relative amounts of the diazocine monomer and DCDPS (X and Y respectively) were varied. All of the polymers gave transparent, flexible films when cast from THF.

Comparative Example 5R

A polymer was made with DCDPS as only dihalogenated monomer. The results are shown in Table I.

Comparative Example 6R

Polymers were made with either DCDPS or dibenzodiazocine-containing monomer as the only monomer. The results are shown in Table I.

TABLE I

| Example | Diazocine X = | DCDPS Y = | DSC $T_g$ (° C.) | GPC $M_w$ | TGA $T_{onset}$ (° C.) | TGA % char @800° C. |
|---|---|---|---|---|---|---|
| 1 | 0.50 | 0.50 | 229 | 51,800 | 506 | 48 |
| 2 | 0.75 | 0.25 | 248 | 49,200 | 504 | 45 |
| 3 | 0.50 | 0.50 | 218 | 28,610 | — | — |
| 4 | 0.25 | 0.75 | 210 | 52,400 | 506 | 38 |
| 5R | 0 | 1 | 189 | 50,282 | 508 | 32 |
| 6R | 1 | 0 | 260 | 38,210 | 501 | 45 |

All of the copolymers had single glass transition temperatures indicating a more random or alternating distribution of the diazocine and sulfone units in the polymer chains. Blocky copolymers typically show two glass transition temperatures. The $T_g$ increased and the temperature of onset of thermal degradation ($T_{onset}$) remained relatively constant with an increase in the amount of diazocine used. The % char that remained upon reaching 800° C. in the TGA measurement increased with an increase in diazocine. The higher char is a general indication of improved flame resistance.

Example 7

Preparation of a 1:1 Diazocine-Sulfone Biphenol Copolymer

The reaction was conducted in the same way as described in Example 1, except that 11.90 g (0.06389 moles) biphenol, 8.74 g (0.03043 moles) DCDPS, 12.00 g (0.03043 moles) difluorodibenzodiazocine, and 10.60 g (0.0767 moles) K₂CO₃ were used with the DMAc/toluene solvent system. The fibrous, pale yellow solid polymer isolated as described in Example 1 was characterized and the results shown in Table II. The polymer was freely soluble at room temperature in chloroform, THF, DMAc, and NMP, and a 25 μm thick film cast from THF was transparent and flexible.

Examples 8-10

Other examples of diazocine-sulfone biphenol copolymers prepared in the same way as described with the relative amounts of diazocine (X) and DCDPS (Y) indicated in Table II. Example 9 used a nitrogen sweep in place of toluene to remove water.

Comparative Example 11R

A polymer was made with DCDPS or only dihalogenated monomer. The results are shown in Table II.

TABLE II

| Example # | Diazocine X = | DCDPS Y = | $T_g$ (° C.) | GPC $M_w$ | TGA $T_{onset}$ (° C.) | TGA % char |
|---|---|---|---|---|---|---|
| 7 | 0.50 | 0.50 | 254 | 31,950 | 520 | 56 |
| 8 | 0.47 | 0.53 | 277 | 79,080 | — | — |
| 9 | 0.50 | 0.50 | 255 | 32,460 | 514 | 53 |
| 10 | 0.10 | 0.90 | 218 | 32,270 | 527 | 40 |
| 11R | 0 | 1 | 209 | 31,950 | 522 | 40 |

Comparative Example 12R

Physical Blend of Diazocine-Containing and Sulfone-Containing Homopolymers

A 1:1 wt/wt blend of a lab-prepared diazocine-biphenol homopolymer ($M_w$ ~32,000) and lab-prepared DCDPS-biphenol homopolymer (Mw ~31,000) dissolved in THF/DMAc was allowed to dry slowly in a PTFE-dish to form a nearly opaque film that was then dried first in a vacuum oven at 80° C. for 5 hours and then in a convection oven at 200° C. for another 4 hours. DSC of the dried film showed two distinct glass transition temperatures at 214° C. ($T_{g1}$, from the sulfone-biphenol homopolymer) and at 287° C. ($T_{g2}$, from the diazocine-biphenol homopolymers). The presence of two distinct $T_g$'s and the opaque appearance of the film indicates that these polymers are likely immiscible in this proportion. Thus, simply blending diazocine homopolymer with polysulfones in other proportions would likely result in a heterogeneous blend that would not be expected to be readily processable, or have as consistent appearance and properties as the copolymers described in the examples.

Example 13

Preparation of a Diazocine Ketone Biphenol Copolymer-Diazocine:Ketone=9:1

In a 4-neck 250-ml round bottom flask fitted with Barrett trap, overhead stirrer, condenser, and nitrogen inlet, were placed 10.65 g (0.0270 moles) difluorodibenzodiazocine, 0.66 g 4,4'-DFBP, 5.87 g (0.0315 moles) biphenol, 5.22 g K₂CO₃, 90 ml DMAc, and 50 ml toluene. The mixture was stirred and warmed to 140-145° C. for five hours. The Barrett trap was then drained and the internal temperature increased to 155-159° C. The reaction mixture was stirred at this temperature for 16 hours, cooled to 140° C., 9 g methyl chloride added over 15 minutes, purged with nitrogen, and cooled to ~70° C. The viscous mixture was then filtered through a 2.7 μm glass fiber filter. The clear yellow polymer solution was poured slowly in to 600 ml methanol under vigorous agitation at 42° C. The resulting slurry was stirred for 30 minutes and then filtered to give a pale yellow porous powder. The powder was washed three times with warm methanol and then dried in a vacuum oven for 4 hours. The polymer was readily soluble in methylene chloride, THF, and DMAc, and films cast from the polymer solutions were clear and flexible. DSC of the polymer made in Example 9 showed a single $T_g$=283° C. and no melting point <350° C.

The infrared spectrum (FTIR/ATR) of the copolymer, dried overnight at 220° C. and cast from a solution in methylene chloride, is compared to an infrared spectrum of a homopolymer made without the ketone. The difference spectrum exhibited at least four absorption peaks indicating the presence of a ketone (benzophenone) in the polymer. The infrared spectrum of benzophenone, for example, has corresponding absorptions at 1666 cm$^{-1}$, 1461 cm$^{-1}$, 1277 cm$^{-1}$, and 919 cm$^{-1}$, which are similar to the peaks indicated by arrows in the difference spectrum. Thus, the ketone was likely incorporated in the diazocine-polymer structure.

Examples 14 and 15

The basic properties of two diazocine-biphenol copolymers made with mixtures of two different bisphenols and difluorodiazocine using conditions described in Example 1 are shown in Table III. The relative amounts of bisphenols were 1:1 for both cases

TABLE III

| Example # | Bisphenol-1 | Bisphenol-2 | $T_g$ (° C.) | GPC $M_w$ | TGA $T_{onset}$ (° C.) | TGA % char |
|---|---|---|---|---|---|---|
| 14 | Bisphenol A | Hydroquinone | 277 | 55,160 | 502 | 53 |
| 15 | Bisphenol A | Biphenol | 286 | 52,790 | 505 | 48 |

The invention claimed is:

1. A copolymer (C) comprising recurring units (A) of the general structural formula:

-D-G-Ar$_b$-G- and recurring units (B) of the general structural formula:

—Ar$_a$-G-Ar$_b$-G- wherein:

D is at least one dibenzodiazocine-containing divalent group;

Ar$_a$ is at least one dibenzodiazocine-free divalent group selected from the group consisting of:

C$_{12}$-C$_{50}$ divalent groups (GS) containing at least one sulfone unit [—S(=O)$_2$—] and at least two C$_6$-C$_{40}$ arylene units;

C$_{12}$-C$_{50}$ divalent groups (GK) containing at least one ketone unit [—C(=O)—] and at least two C$_6$-C$_{40}$ arylene units;

and mixtures of these groups;

each Ar$_b$ is at least one dibenzodiazocine-free divalent group selected from the group consisting of C$_6$-C$_{50}$ arylene groups and C$_{12}$-C$_{50}$ aromatic hydrocarbon groups of the general formula (I):

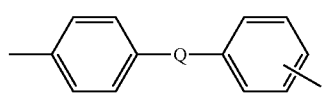

(I)

wherein the unassigned positional isomer is either meta or para to Q, and Q is a direct covalent bond or a divalent group containing from 0 to 38 carbon atoms, the Ar$_b$ being independently chosen from each other; and each G is at least one divalent group selected from the group consisting of ether groups (—O—) and thioether groups (—S—), the G being independently chosen from each other.

2. The copolymer (C) according to claim 1, wherein the divalent group Ar$_b$ contained in the recurring units (A) is identical to the divalent group Ar$_b$ contained in the recurring units (B), and wherein the divalent groups G contained in the recurring units (A) are identical to each other on one hand, and to the divalent groups G contained in the recurring units (B) on the other hand.

3. The copolymer (C) according to claim 1, of which the recurring units consist essentially of recurring units (A) and (B).

4. The copolymer (C) according to claim 1, wherein the divalent group D is of the following formula:

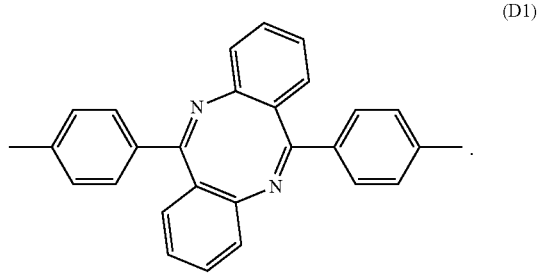

(D1)

5. The copolymer (C) according to claim 1, wherein the divalent group Ar$_a$ is

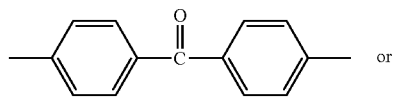

or

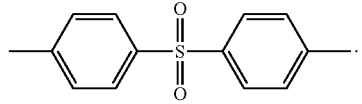

6. The copolymer (C) according to claim 1, wherein each divalent group $Ar_b$ is p-biphenylene

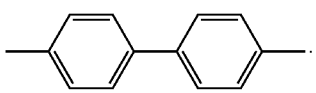

7. The copolymer (C) according to claim 1, wherein each divalent group G is an ether group (—O—).

8. A method for preparing a copolymer according to claim 1, which comprises synthesizing said copolymer via step-growth polymerization involving nucleophilic displacement reactions between:

at least one difunctional monomer (M1) comprising a divalent group D, of general formula X-D-X,
at least one difunctional monomer (M2) comprising a divalent group $Ar_a$, of general formula X—$Ar_a$—X, and
at least one difunctional monomer (M3) comprising a divalent group $Ar_b$, of general formula H-G-$Ar_b$-G-H,
wherein:
each H is a hydrogen atom;
each X is at least one divalent group selected from the group consisting of halogen atoms, nitro groups, and mixtures thereof, the X being independently chosen from each other;
D is at least one dibenzodiazocine-containing divalent group;
$Ar_a$ is at least one dibenzodiazocine-free divalent group selected from the group consisting of:
$C_{12}$-$C_{50}$ divalent groups (GS) containing at least one sulfone unit [—S(=O)$_2$—] and at least two $C_6$-$C_{40}$ arylene units;
$C_{12}$-$C_{50}$ divalent groups (GK) containing at least one ketone unit [—C(=O)—] and at least two $C_6$-$C_{40}$ arylene units;
and mixtures of these groups;
each $Ar_b$ is at least one dibenzodiazocine-free divalent group selected from the group consisting of $C_6$-$C_{50}$ arylene groups and $C_{12}$-$C_{50}$ aromatic hydrocarbon groups of the general formula (I):

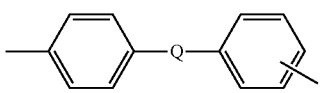 (I)

wherein the unassigned positional isomer is either meta or para to Q, and Q is a direct covalent bond or a divalent group containing from 0 to 38 carbon atoms, the $Ar_b$ being independently chosen from each other; and
each G is at least one divalent group selected from the group consisting of ether groups (—O—) and thioether groups (—S—), the G being independently chosen from each other.

9. The method according to claim 8, wherein the copolymer prepared by said method is a copolymer (C) comprising recurring units (A) of the general structural formula:

-D-G-$Ar_b$-G- and recurring units (B) of the general structural formula:

—$Ar_a$-G-$Ar_b$-G-, wherein D, G, $Ar_a$ and $Ar_b$ are defined in claim 8.

10. The method according to claim 8, wherein the molar amount of the monomer (M3) is substantially equal to the sum of the molar amounts of the monomers (M1) and (M2).

11. The method according to-claim 8, wherein each X is a fluorine atom, and wherein the difunctional monomer (M2) is a diol of general formula HO—$Ar_b$—OH.

12. The copolymer (C) according to claim 1, wherein:
D is a dibenzodiazocine-containing divalent group of formula

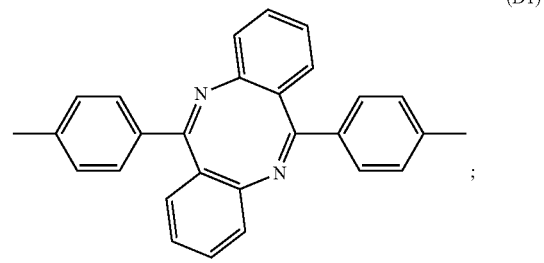 (D1)

$Ar_a$ is

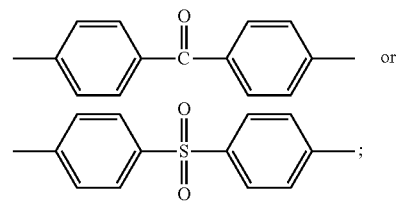

each $Ar_b$ is at least one dibenzodiazocine-free divalent group selected from the group consisting of $C_6$-$C_{50}$ arylene groups and $C_{12}$-$C_{50}$ aromatic hydrocarbon groups of the general formula (I):

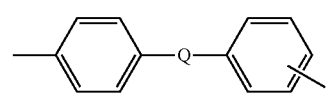 (I)

wherein the unassigned positional isomer is either meta or para to Q, and Q is a direct covalent bond or a divalent group containing from 0 to 38 carbon atoms, the $Ar_b$ being independently chosen from each other; and
each G is an ether group (—O—).

13. The copolymer (C) according to claim 12, wherein each $Ar_b$ is p-biphenylene

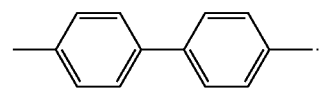

14. The copolymer (C) according to claim 13, wherein the recurring units of said copolymer (C) consist essentially of recurring units (A) and (B).

* * * * *

UNITED STATES PATENT AND TRADEMARK OFFICE
CERTIFICATE OF CORRECTION

PATENT NO. : 8,420,750 B2
APPLICATION NO. : 12/865776
DATED : April 16, 2013
INVENTOR(S) : Charles Hoppin It is certified that error appears in the above-identified patent and that said Letters Patent is hereby corrected as shown below:

On the title page, Item (54) and in the specification, Column 1, the title should read:
--COPOLYMERS OF DIBENZODIAZOCINE WITH DIFUNCTIONAL MONOMERS CONTAINING SULFONE AND/OR KETONE UNITS--

In the Claims:

Column 38 Line 4 "The method according to-claim 8" should read --The method according to claim 8--

Signed and Sealed this
Twenty-fifth Day of June, 2013

Teresa Stanek Rea
*Acting Director of the United States Patent and Trademark Office*